United States Patent
Jeng et al.

(10) Patent No.: US 8,951,826 B2
(45) Date of Patent: Feb. 10, 2015

(54) METHOD FOR INCREASING PHOTODIODE FULL WELL CAPACITY

(75) Inventors: Jung-Chi Jeng, Tainan (TW);
Chih-Cherng Jeng, Madou Township (TW); Chih-Kang Chao, Tainan (TW); Ching-Hwanq Su, Tainan (TW); Yan-Hua Lin, Tainan (TW); Yu-Shen Shih, Hemei Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 221 days.

(21) Appl. No.: 13/429,002

(22) Filed: Mar. 23, 2012

(65) Prior Publication Data
US 2013/0193539 A1    Aug. 1, 2013

Related U.S. Application Data

(60) Provisional application No. 61/593,021, filed on Jan. 31, 2012.

(51) Int. Cl.
*H01L 21/265* (2006.01)

(52) U.S. Cl.
USPC .......... 438/73; 257/E21.334; 257/291

(58) Field of Classification Search
CPC .......... H01L 27/1463; H01L 27/14643; H01L 27/14687; H01L 27/14603; H01L 27/14605; H01L 27/14607
USPC .............. 257/E21.334, 291; 438/73
See application file for complete search history.

(56) References Cited

U.S. PATENT DOCUMENTS

| | | | |
|---|---|---|---|
| 6,512,280 B2 * | 1/2003 | Chen et al. | 257/465 |
| 8,004,056 B2 | 8/2011 | Maruyama et al. | |
| 8,035,182 B2 | 10/2011 | Takeuchi | |
| 8,035,714 B2 | 10/2011 | Itonaga | |
| 8,357,984 B2 * | 1/2013 | Mao et al. | 257/447 |
| 2003/0151076 A1 * | 8/2003 | Kim | 257/233 |
| 2004/0094784 A1 * | 5/2004 | Rhodes et al. | 257/291 |
| 2005/0087782 A1 * | 4/2005 | Rhodes et al. | 257/292 |
| 2006/0284274 A1 * | 12/2006 | Lee et al. | 257/431 |
| 2007/0069321 A1 * | 3/2007 | Hwang | 257/462 |
| 2008/0157249 A1 * | 7/2008 | Hwang | 257/432 |
| 2008/0197389 A1 * | 8/2008 | Park et al. | 257/292 |
| 2008/0224247 A1 * | 9/2008 | Hsu et al. | 257/432 |
| 2009/0068784 A1 * | 3/2009 | Kim | 438/70 |
| 2011/0031576 A1 * | 2/2011 | Iwasa et al. | 257/440 |
| 2012/0077301 A1 * | 3/2012 | Ahn et al. | 438/73 |
| 2013/0001722 A1 * | 1/2013 | Chen et al. | 257/432 |

FOREIGN PATENT DOCUMENTS

| | | |
|---|---|---|
| JP | 2006032681 | 2/2006 |
| JP | 2008091702 A | 4/2008 |
| JP | 2010114275 | 5/2010 |
| KR | 1020050082587 A | 8/2005 |
| KR | 1020050082588 A | 8/2005 |
| KR | 1020060004064 A | 1/2006 |

* cited by examiner

*Primary Examiner* — Steven J Fulk
(74) *Attorney, Agent, or Firm* — Slater & Matsil, L.L.P.

(57) ABSTRACT

A backside illuminated CMOS image sensor comprises an extended photo active region formed over a substrate using a first high energy ion implantation process and an isolation region formed over the substrate using a second high energy ion implantation process. The extended photo active region is enclosed by the isolation region, which has a same depth as the extended photo active region. The extended photo active region helps to increase the number of photons converted into electrons so as to improve quantum efficiency.

20 Claims, 10 Drawing Sheets

METHOD FOR INCREASING PHOTODIODE FULL WELL CAPACITY

This application claims the benefit of U.S. Provisional Application No. 61/593,021, filed on Jan. 31, 2012, entitled "Method to Increase Photo-Diode Full Well Capacity and Resulting Structure," which application is hereby incorporated herein by reference.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect metal layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers (e.g., opaque and reflective metal layers) in the light path may limit the amount of light absorbed by the photo diode so as to reduce quantum efficiency. In contrast, there is no obstruction from additional layers (e.g., metal layers) in a BSI image sensor. Light is incident on the backside of the CMOS image sensor. As a result, light can strike the photo diode through a direct path. Such a direct path helps to increase the number of photons converted into electrons.

Full well capacitor (FWC) is a performance index indicating the dynamic range of an image sensor. In other words, the amount of charge that an individual pixel can store before saturating is measured by FWC. Greater FWC means a higher dynamic range and better signal-to-noise ratio. On the other hand, smaller FWC may cause saturation as well as image smearing due to a blooming phenomenon.

FWC is related to the pixel dimensions of a photodiode. As technologies evolve, the FSI image sensor has been shrunk to a smaller pixel pitch. The smaller pixel pitch leads to smaller FWC, which may reduce the dynamic range of the FSI image sensor.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, backside illuminated image sensors. The embodiments of the disclosure may also be applied, however, to a variety of image sensors. Hereinafter, various embodiments will be explained in detail with reference to the accompanying drawings.

Figure 1:
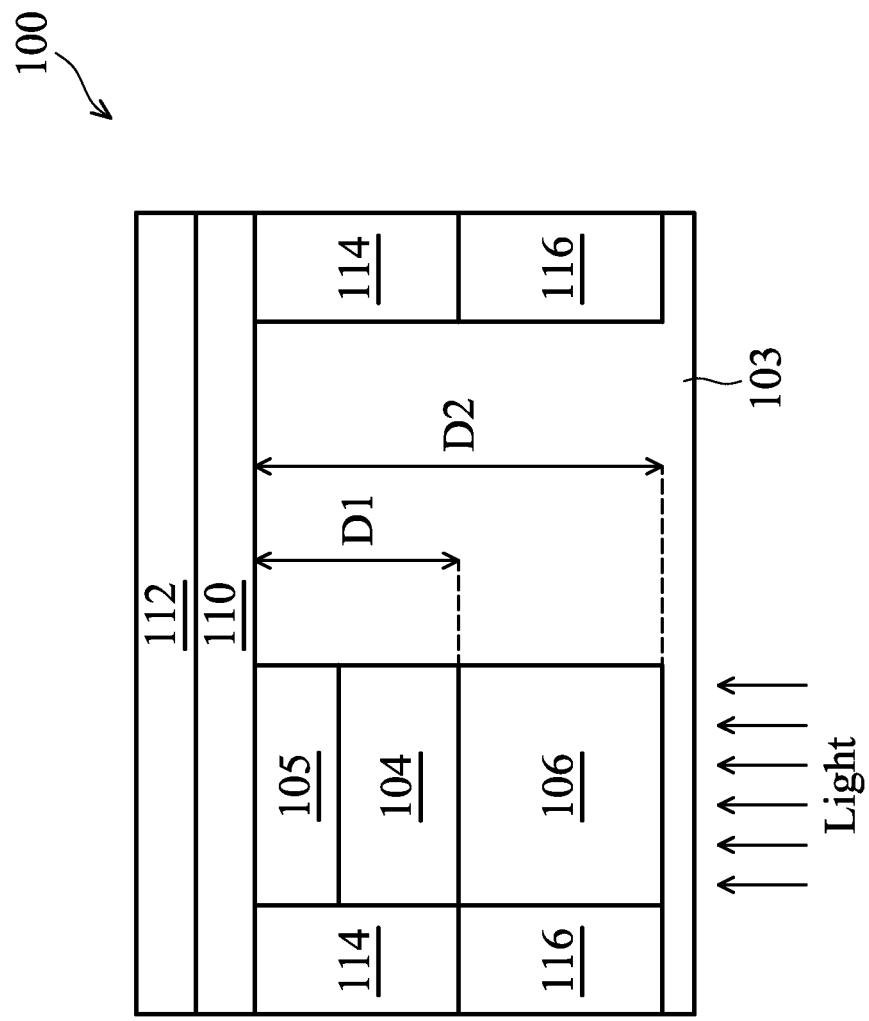
FIG. 1 illustrates a simplified cross sectional view of a backside illuminated image sensor in accordance with an embodiment.

FIG. 1 illustrates a simplified cross sectional view of a backside illuminated image sensor in accordance with an embodiment. The backside illuminated image sensor 100 is formed in an epitaxial layer over a silicon substrate. According to the fabrication process of backside illuminated image sensors, the silicon substrate has been removed in a backside thinning process. As shown in FIG. 1, a portion of epitaxial layer 103 remains. A p-type photo active region 105, an n-type photo active region 104 and an extended n-type photo active region 106 are formed in the remaining epitaxial layer 103.

The photo active regions such as the p-type photo active region 105 and the n-type photo active region 104 may form a PN junction, which functions as a photodiode. Furthermore, the extended n-type photo active region 106 extends the photodiode to a deeper region so that light can be converted into electrons without being absorbed by the substrate. In accordance with an embodiment, the photo active regions (e.g., the n-type photo active region 104) are formed on an epitaxial layer 103 grown from a p-type semiconductor substrate (not shown).

The backside illuminated image sensor 100 further comprises an isolation region 114 and an extended isolation region 116 formed in the epitaxial layer 103. As shown in FIG. 1, the photodiode is enclosed by the isolation regions. In particular, the isolation regions help to prevent crosstalk and interference from adjacent pixels (not shown). In accordance with an embodiment, the isolation region 114 may be formed of P-type materials such as boron, BF2 and the like. In addition, the isolation region 114 may comprise a shallow trench isolation (STI) structure (not shown). In accordance with an embodiment, the isolation region 114 has a doping concentration of about $10^{12}/cm^3$. The isolation region 114 has a doping depth in a range from about 0 um to about 2 um.

As shown in FIG. 1, the photo active region is extended to a deeper region via the extended n-type photo active region 106. In order to separate the extended n-type photo active region 106 from adjacent pixel (not shown), the extended isolation region 116 is employed to prevent crosstalk and interference that can affect the performance of the extended n-type photo active region 106. In accordance with an embodiment, the extended isolation region 116 is formed of p-type materials such as boron, BF2 and the like. The extended isolation region 116 has a doping concentration of about $5\times10^{11}/cm^3$. The extended isolation region 116 has a doping depth up to 5 um.

The backside illuminated image sensor 100 may comprise a plurality of additional layers such as dielectric layer 110 and interconnect metal layer 112 formed over the substrate. For simplicity, hereinafter the side having additional layers of the backside illuminated image sensor 100 is referred to as a front side, while the side having the substrate is referred to as a backside.

A dielectric layer 110 is typically formed over the front side of the substrate. It should be noted that other circuitry (not shown), such as transistors, capacitors, or the like, may also be formed in the epitaxial layer 103. In accordance with an embodiment, the dielectric layer 110 forms a planarized layer upon which other layers (e.g., metal interconnect layers) may be formed. In an embodiment, the dielectric layer 110 may be formed of low-K dielectric materials such as silicon oxide, borophosphosilicate glass (BPSG), phosphosilicate glass (PSG), fluorinated silicate glass (FSG), carbon-doped silicon oxide or the like. The dielectric layer 110 may be formed by any suitable techniques such as chemical vapor deposition (CVD) techniques or the like.

A metal interconnect layer 112 may be formed over the dielectric layer 110. The metal interconnect layer 112 can be patterned by plasma etching or a damascene process and may be formed of any conductive material suitable for a particular application. Materials that may be suitable include, for example, aluminum, copper, doped polysilicon or the like. Contacts and vias (not shown) may be formed to provide electrical connectivity between the metal interconnect layer and underlying circuitry.

Throughout the description, the depth of a photo active region is defined as the distance between the front side of the substrate and the photo active region's edge opposite to the front side. For example, the depth of the photo active region 104 is defined as D1, which is in a range from about 2 um to about 2.5 um in accordance with an embodiment. Likewise, the depth of the extended photo active region 106 is defined as D2, which is in a range from about 4 um to 5 um.

An advantageous feature of having an extended photo active region (e.g., the extended photo active region 106) is that extending the photo active region to a deeper region helps light strike the photo active region so that more photons can be converted into electrons without being absorbed by the substrate. In addition, a thicker photo active region helps to increase photodiode full well capacity. As a result, the quantum efficiency of the backside illuminated image sensor 100 may be improved.

Figure 2:
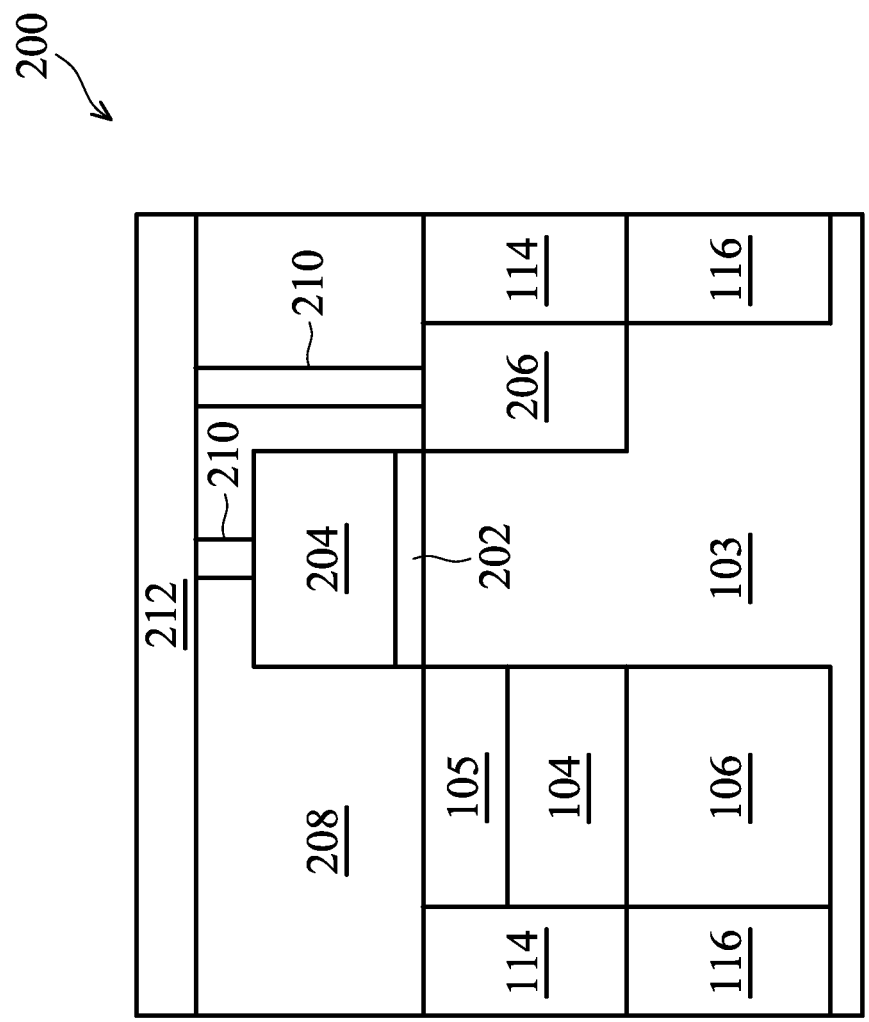
FIG. 2 illustrates a cross sectional view of a backside illuminated image sensor in accordance with another embodiment.

FIG. 2 illustrates a cross sectional view of a backside illuminated image sensor in accordance with another embodiment. The backside illuminated image sensor 200 includes photo active regions embedded in an epitaxial layer 103 and a logic circuit formed over the epitaxial layer 103. The photo active regions (e.g., the n-type photo active region 104 and the extended n-type photo active region 106) and isolation regions (e.g., the isolation region 114 and the extended isolation region 116) have been described in detail with respect to FIG. 1, and hence are not discussed to avoid unnecessary repetition.

The logic circuit coupled to the photodiode may comprise a transistor including a gate electrode 204. In particular, the transistor may generate a signal related to the intensity or brightness of light that impinges on the photodiode. In accordance with an embodiment, the transistor may be a transfer transistor. However, the transistor may be an example of the many types of functional transistors that may be utilized within the backside illuminated image sensor 200. For example, while the transistor illustrated in FIG. 2 is a transfer transistor, various embodiments may include other transistors located within the backside illuminated image sensor 200, such as a reset transistor, source follower transistor, or a select transistor. These transistors may be arranged, for example, to form a four transistor image sensor. All suitable transistors and configurations that may be utilized in an image sensor are fully intended to be included within the scope of the embodiments.

The transistor shown in FIG. 2 may comprise a gate dielectric layer 202 formed over the epitaxial layer 103 and a gate electrode 204 formed over the gate dielectric. The gate dielectric layer 202 and gate electrode 204 may be formed and patterned by any suitable process known in the art. The gate dielectric layer 202 may be a high-K dielectric material, such as silicon oxide, silicon oxynitride, silicon nitride, an oxide, a nitrogen-containing oxide, aluminum oxide, lanthanum oxide, hafnium oxide, zirconium oxide, hafnium oxynitride, a combination thereof, or the like.

In accordance with an embodiment, the gate dielectric layer 202 comprises an oxide layer, which may be formed by any oxidation process, such as wet or dry thermal oxidation or by chemical vapor deposition (CVD) techniques using tetra-ethyl-ortho-silicate (TEOS) and oxygen as a precursor.

The gate electrode 204 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In accordance with an embodiment, the gate electrode 204 may be formed of poly-silicon by depositing doped or undoped poly-silicon by low-pressure chemical vapor deposition (LPCVD).

A drain/source region 206 may be formed in the epitaxial layer 103 on an opposing side of the gate dielectric 202 from the photodiode. In accordance with an embodiment, the drain/source region 206 may be formed by implanting appropriate n-type dopants such as phosphorous, arsenic, antimony or the like.

As shown in FIG. 2, an inter-layer dielectric (ILD) layer 208 is formed over the substrate including the photodiode. The ILD layer 208 may comprise a material such as boron phosphorous silicate glass (BPSG), although any suitable dielectrics may be used for either layer. The ILD layer 208 may be formed using a process such as PECVD, although other processes, such as LPCVD, may alternatively be used.

There may be a plurality of contacts 210 coupled to the gate electrode 204 and the drain/source 206. The contacts 210 may be formed through the ILD layer 208 with suitable photolithography and etching techniques. Generally, these photolithography techniques involve depositing a photoresist material, which is masked, exposed, and developed to expose portions of the ILD layer 208 that are to be removed. The remaining photoresist material protects the underlying material from subsequent processing steps, such as etching.

The contacts 210 may comprise a barrier/adhesion layer (not shown) to prevent diffusion and provide better adhesion for the contacts 210. In an embodiment, the barrier layer is formed of one or more layers of titanium, titanium nitride, tantalum, tantalum nitride, or the like. The barrier layer may be formed through chemical vapor deposition, although other techniques could alternatively be used.

The contacts 210 may be formed of any suitable conductive material, such as a highly-conductive, low-resistive metal, elemental metal, transition metal, or the like. In accordance with an embodiment, the contacts 210 are formed of tungsten, although other materials, such as copper, could alternatively be utilized. In an embodiment in which the contacts 210 are formed of tungsten, the contacts 210 may be deposited by CVD techniques known in the art, although any method of formation could alternatively be used.

After the contacts 210 are formed, an interconnect layer 212 is formed over the ILD layer 208. It should be noted that while FIG. 2 illustrates a single interconnect layer 212, the interconnect layer 212 may comprise various conductive and dielectric layers. Those conductive and dielectric layers are collectively referred to as the interconnect layer 212 in FIG. 2. These interconnections may be made through any suitable formation process (e.g., lithography with etching, damascene, dual damascene, or the like) and may be formed using suitable conductive materials such as aluminum alloys, copper alloys or the like.

Figure 3:
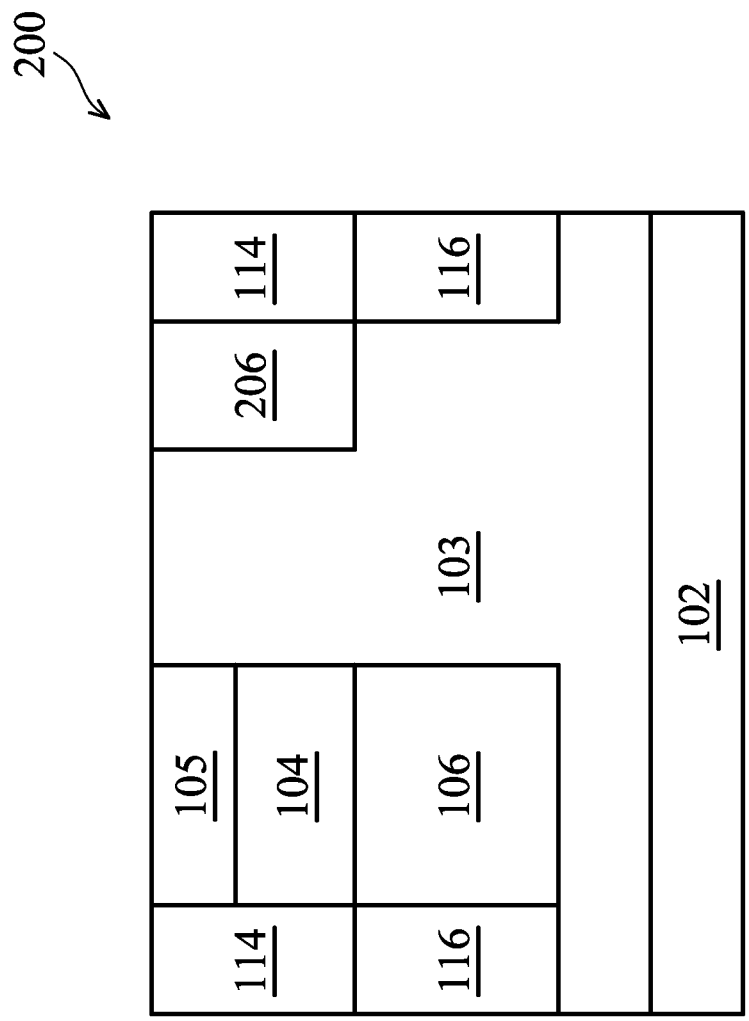
FIG. 3 is a cross sectional view of a backside illuminated image sensor wafer when a front side ion implantation process is performed on a substrate in accordance with an embodiment.

FIGS. 3-8 illustrates a method of fabricating a backside illuminated image sensor in accordance with an embodiment. FIG. 3 is a cross sectional view of a backside illuminated image sensor wafer when a front side ion implantation process is performed on a substrate in accordance with an embodiment. The backside illuminated image sensor wafer 200 comprises a substrate 102 having a first conductivity. In accordance with an embodiment, the substrate 102 is a p-type substrate. The substrate 102 may be formed of silicon, germanium, silicon germanium, graded silicon germanium, semiconductor-on-insulator, carbon, quartz, sapphire, glass, or the like, and may be multi-layered (e.g., strained layers). A p-type epitaxial layer 103 is grown on the p-type substrate 102.

In accordance with an embodiment, p-type impurity ions are implanted from the front side of the wafer into the p-type epitaxial layer 103 to form the p-type photo active region 105. In addition, n-type impurity ions are implanted from the front side of the wafer to form the n-type photo active region 104. In order to further improve the performance of the backside illuminated image sensor 200, a high energy ion beam is employed to implant p-type impurity ions in a deeper region. As a result, the p-type photo active region is extended to form the extended n-type photo active region 106. In accordance with an embodiment, the high energy ion beam has an energy level in a range from about 300 keV to about 5000 keV.

The backside illuminated image sensor wafer 200 may comprise a plurality of pixels (not shown), each of which comprises a PN junction formed by a p-type photo active region (e.g., photo active region 105) and an n-type photo active region (e.g., photo active region 104). In order to prevent crosstalk and interference between adjacent pixels, an isolation region 114 is employed to enclose the photo active regions 104 and 105. In accordance with an embodiment, the isolation region 114 may comprise a shallow trench isolation (STI) structure (not shown). The STI structure may be formed by etching a portion of the substrate to form a trench and filling the trench with oxide and/or other dielectric materials. The isolation region 114 helps to prevent reflected light from adjacent pixels from reaching the photo active region 104 and the photo active region 105.

As shown in FIG. 3, in order to prevent reflected light from affecting the performance of the extended photo active region 106, an extended isolation region 116 is employed to enclose the extended photo active region 106. In particular, the extended isolation region 116 may have a same depth as the extended photo active region 106. The extended isolation region 116 is formed of p-type materials such as boron, BF2 and the like. A high energy ion beam is employed to implant p-type impurity ions in such a deeper region. In accordance with an embodiment, the high energy ion beam has an energy level in a range from about 200 keV to about 3000 keV.

Figure 4:
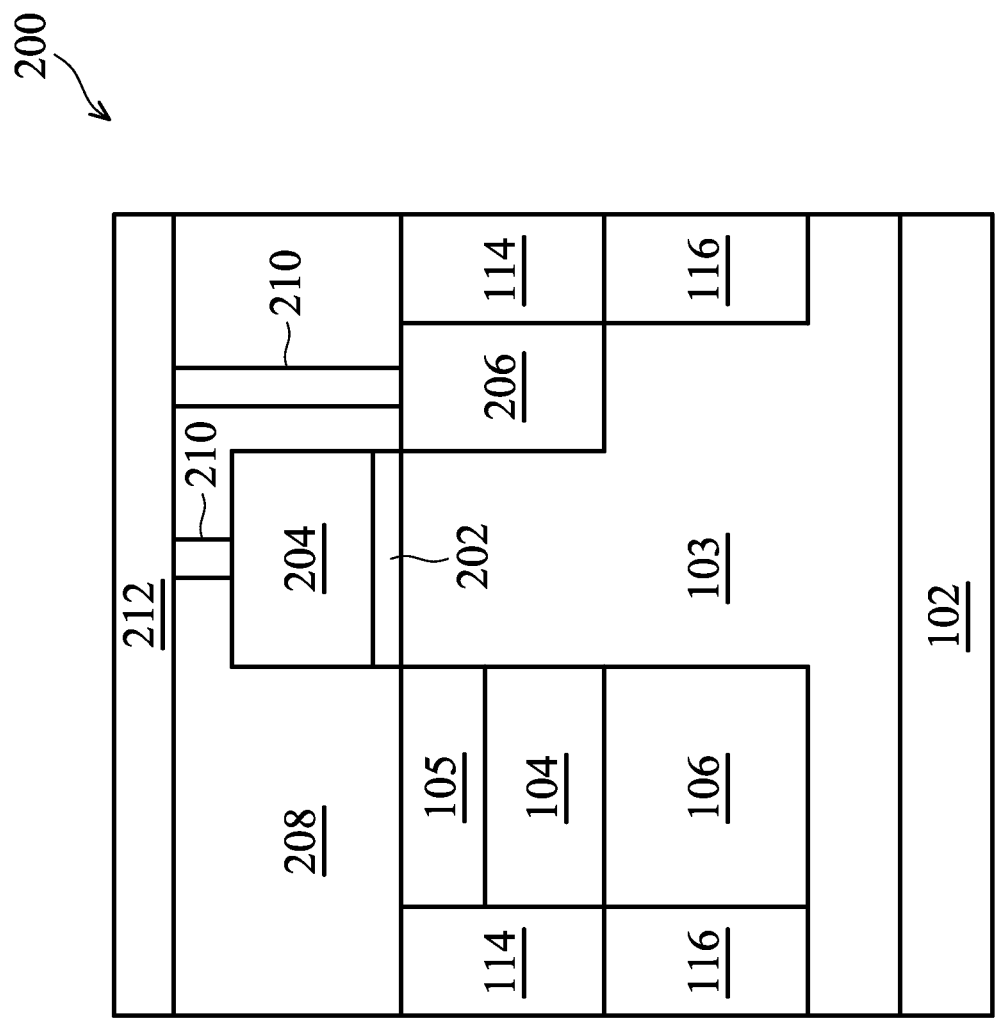
FIG. 4 illustrates a cross sectional view of the semiconductor device shown in FIG. 3 after additional front side layers have been formed over the photo active region in accordance with an embodiment.

FIG. 4 illustrates a cross sectional view of the semiconductor device shown in FIG. 3 after additional front side layers have been formed over the photo active region in accordance with an embodiment. An ILD layer 208 is formed over the epitaxial layer 103. An interconnect layer 212 may be formed over the ILD layer 208. The interconnect layer 212 can be patterned by plasma etching or a damascene process and may be formed of any conductive material suitable for a particular application. Materials that may be suitable include, for example, aluminum, copper, doped polysilicon or the like. Contacts 210 may be formed to provide electrical connectivity between the interconnect layer 212 and underlying circuitry such as gate electrode 204 and the drain/source region 206.

Figure 5:
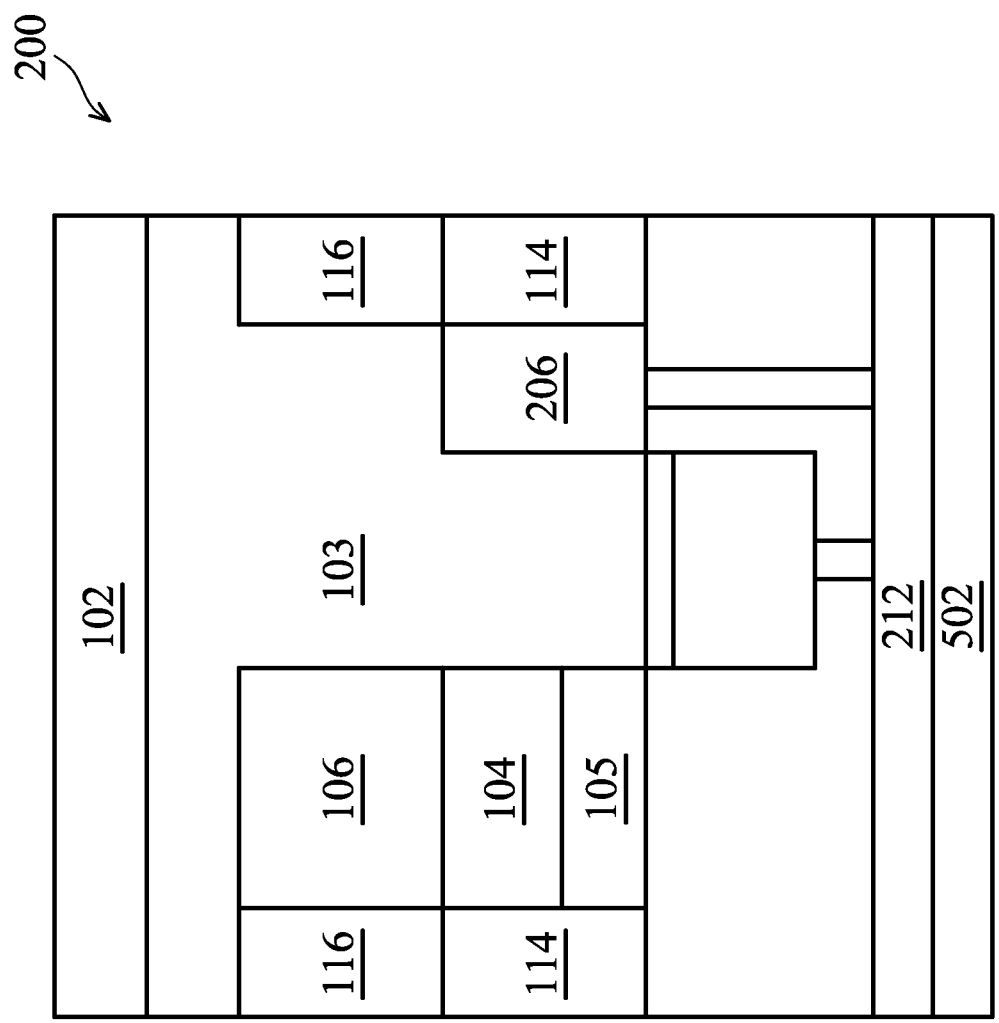
FIG. 5 is a cross sectional view of a backside illuminated image sensor wafer after the wafer is flipped and bonded on a carrier in accordance with an embodiment.

FIG. 5 is a cross sectional view of a backside illuminated image sensor wafer after the wafer is flipped and bonded on a carrier 502 in accordance with an embodiment. Once the interconnect layer 212 is formed, the backside illuminated image sensor wafer 200 is flipped and further bounded on a silicon or glass carrier 502. In particular, the front side of the backside illuminated image sensor wafer 200 faces up toward the carrier 502. Various bonding techniques may be employed to achieve bonding between the backside illuminated image sensor wafer 200 and the carrier 502. In accordance with an embodiment, suitable bonding techniques may include adhesive bonding, vacuum bonding, anodic bonding and the like. The carrier 502 may provide sufficient mechanical support to resist forces due to a grinding step of a thinning process. The thinning process will be described below with respect to FIG. 6.

Figure 6:
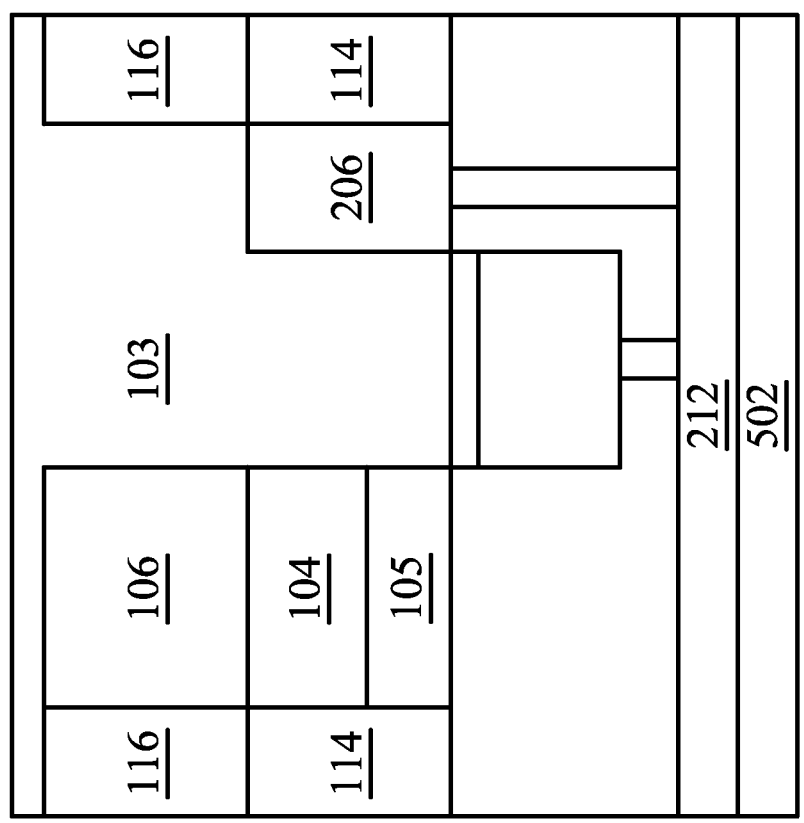
FIG. 6 is a cross sectional view of the backside illuminated image sensor wafer illustrated in FIG. 5 after a thinning process has been applied to the backside of the wafer in accordance with an embodiment.

FIG. 6 is a cross sectional view of the backside illuminated image sensor wafer illustrated in FIG. 5 after a thinning process has been applied to the backside of the wafer in accordance with an embodiment. According to the fabrication processes of backside illuminated image sensors, the substrate is thinned until the substrate 102 (illustrated in FIG. 5) is removed and the epitaxial layer 103 is exposed. More particularly the backside the substrate (e.g., the remaining of the p-type epitaxial layer 103) of the backside illuminated image sensor wafer 200 may be thinned to a thickness in a range from about 4 um to about 5 um. Such a thin substrate layer allows light to pass through the substrate (not shown) and hit photo diodes embedded in the substrate without being absorbed by the substrate.

The thinning process may be implemented by using suitable techniques such as grinding, polishing and/or chemical etching. In accordance with an embodiment, the thinning process may be implemented by using a chemical mechanical polishing (CMP) process. In a CMP process, a combination of etching materials and abrading materials are put into contact with the back side of the substrate and a grinding pad (not shown) is used to grind away the back side of the substrate until a desired thickness is achieved.

Figure 7:
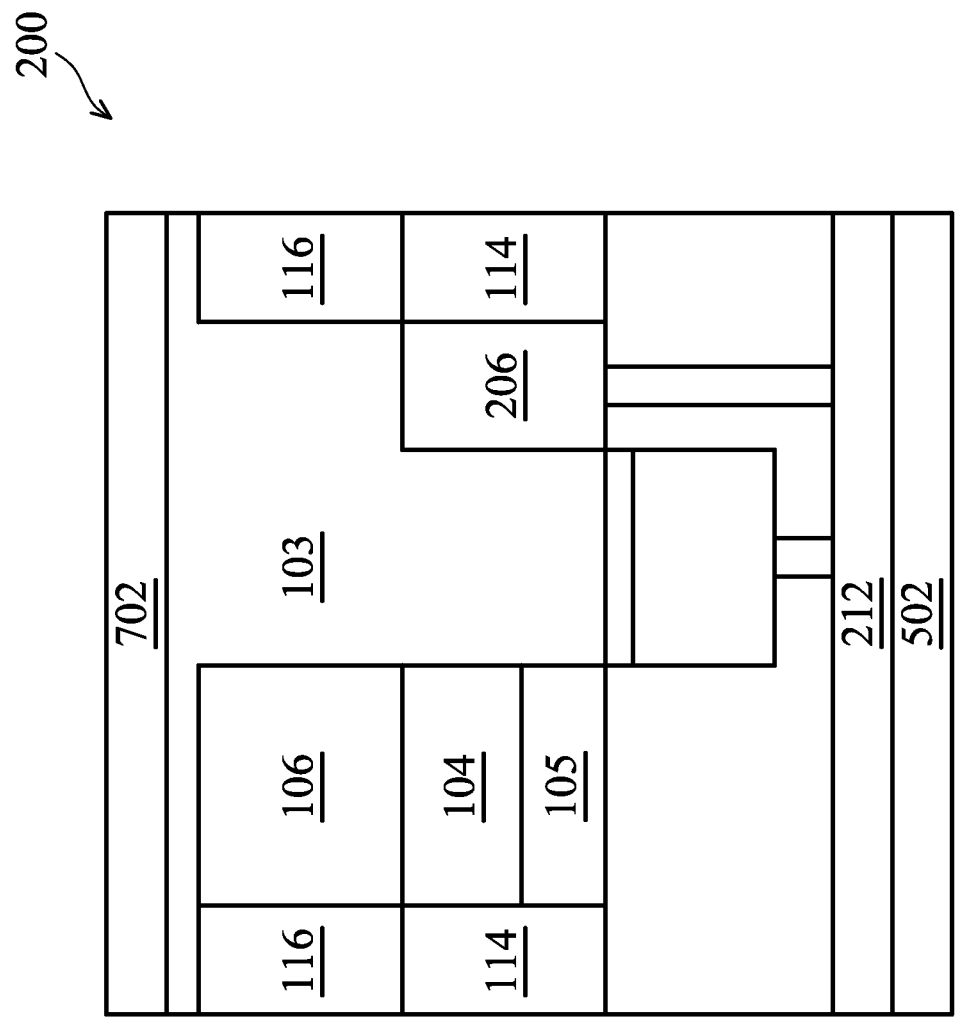
FIG. 7 is a cross sectional view of the backside illuminated image sensor wafer illustrated in FIG. 6 after a thin P+ layer has been applied to the backside of the wafer in accordance with an embodiment.

FIG. 7 is a cross sectional view of the backside illuminated image sensor wafer illustrated in FIG. 6 after a thin p+ ion layer has been applied to the backside of the wafer in accordance with an embodiment. Furthermore, the thin p+ ion layer 702 may be formed on the backside of the thinned substrate to increase the number of photons converted into electrons. The p+ ion implantation process may cause crystal defects. In order to repair crystal defects and activate the implanted p+ ions, a laser annealing process may be performed on the backside of the backside illuminated image sensor wafer 200.

Figure 8:
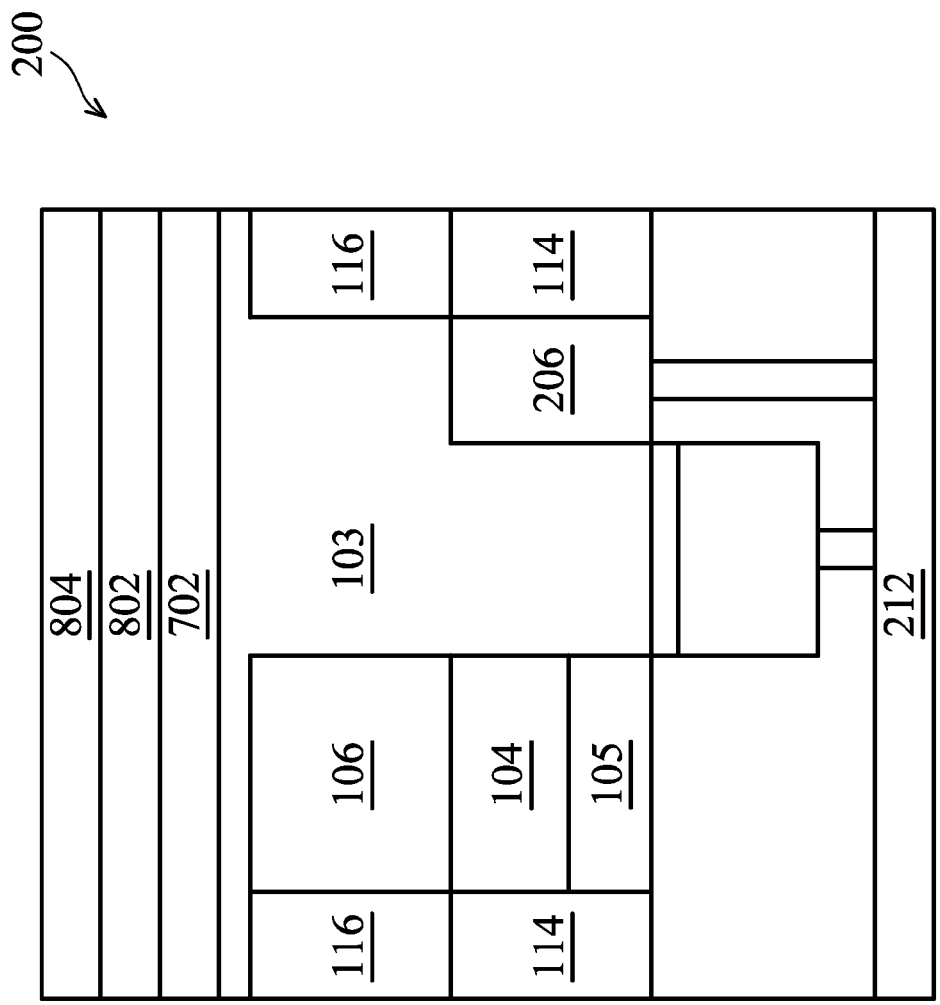
FIG. 8 is a cross sectional view of the backside illuminated image sensor wafer illustrated in FIG. 7 after a color filter layer and a microlens layer have been applied in accordance with an embodiment.

FIG. 8 is a cross sectional view of the backside illuminated image sensor wafer illustrated in FIG. 7 after a color filter layer and a mircolens layer have been applied in accordance with an embodiment. The color filter layer 802 may be used to allow specific wavelengths of light to pass while reflecting other wavelengths, thereby allowing the image sensor to determine the color of the light being received by the photo active region 104. The color filter layer 802 may vary, such as a red, green, and blue filter. Other combinations, such as cyan, yellow, and magenta, may also be used. The number of different colors of the color filters 802 may also vary.

In accordance with an embodiment, the color filter layer 802 may comprise a pigmented or dyed material, such as an acrylic. For example, polymethyl-methacrylate (PMMA) or polyglycidylmethacrylate (PGMS) are suitable materials with which a pigment or dye may be added to form the color filter layer 802. Other materials, however, may be used. The color filter layer 802 may be formed by any suitable method known in the art.

The microlens layer 804 may be formed of any material that may be patterned and formed into lenses, such as a high transmittance, acrylic polymer. The microlens layer 804 is about 0.1 um to about 2.5 um in thickness. In accordance with an embodiment, the microlens layer 804 may be formed using a material in a liquid state and spin-on techniques known in the art. This method has been found to produce a substantially planar surface and a microlens layer 804 having a substantially uniform thickness, thereby providing greater uniformity in the microlenses. Other methods, such as deposition techniques like chemical vapor deposition (CVD), physical vapor deposition (PVD), or the like, may also be used.

Figure 9:
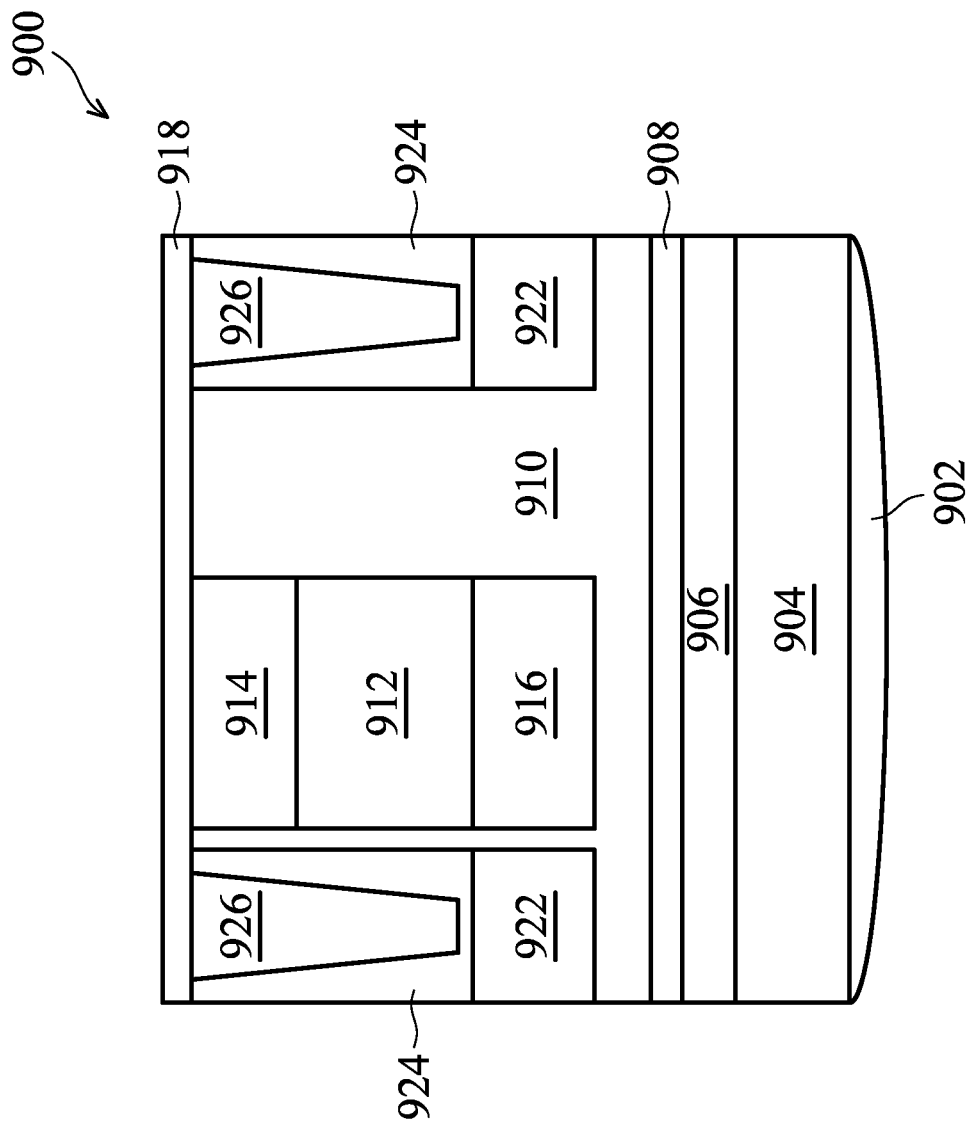
FIG. 9 illustrates a cross sectional view of a backside illuminated image sensor in accordance with another embodiment.

FIG. 9 illustrates a cross sectional view of a backside illuminated image sensor in accordance with another embodiment. In a backside illuminated image sensor, there may be a plurality of pixels, each of which is a photodiode formed in a silicon substrate. In accordance with an embodiment, the substrate 910 may be a p-type epitaxial layer grown from a p-type substrate (not shown). For simplicity, only one pixel is illustrated to show inventive aspects of various embodiments.

As shown in FIG. 9, the pixel 900 includes a photodiode formed by a p-type doped region 914, an n-type doped region 912 and an extended n-type doped region 916. The p-type doped region 914 may be formed by using an ion implantation process from a front side of the wafer. In accordance with an embodiment, the p-type doped region 914 is doped with p-type doping materials such as boron. The doping concentration of the p-type doped region 914 is in a range from about $10^{16}/cm^3$ to about $10^{19}/cm^3$.

In accordance with an embodiment, the n-type doped region 912 and the extended n-type doped region 916 may be formed by using an implantation process similar to that of forming the p-type doped region 914 but having a higher implantation energy level. N-type doping materials such as phosphorus are doped into the epitaxial layer 910 to form the n-type doped region 912. In accordance with an embodiment, the front side ion implantation process may generate a doping concentration in a range from about $10^{16}/cm^3$ to about $10^{19}/cm^3$ The higher implantation energy level helps to extend the photo diode to a deeper region of the substrate 910. Such a photodiode extension may improve quantum efficiency. In a backside illuminated image pixel, the substrate has to be thinned to a thickness of about 2 um because incoming light such as blue light can only penetrate the substrate at a depth of about 1.5 um. However, a thinned substrate may not provide a larger P-N junction as well as full well capacity for photon-electron conversion. By employing a high energy ion beam, the P-N junction is extended to a deeper region. As such, a larger P-N junction is available for incoming photons. Therefore, the quantum efficiency of the pixel 900 is improved as a consequence.

In order to avoid interference from adjacent pixels, an isolation region may be employed to prevent cross walk between adjacent pixels. The isolation region is formed by a STI structure 926, a cell p-well (CPW) region 924 and a deep p-well (DPW) region 922. The formation of the STI structure has been described above with respect to FIG. 2, and hence is not discussed herein to avoid repetition.

The CPW region 924 is formed of P-type materials such as boron and the like. The CPW region 924 has a doping concentration of about $10^{12}/cm^3$. The CPW region 924 has a doping depth in a range from about 0 um to about 2 um. The DFW region 922 has a doping concentration of about $5\times10^{11}/$ cm³. The DPW region 922 has a doping depth in a range from about 4 um to about 5 um. The pixel 900 may include other layers such as p+ ion layer 908, anti-reflection layer 906, color filter layer 904 and micro lens layer 902, which are well known in the art, and hence is not discussed in further detail herein.

Figure 10:
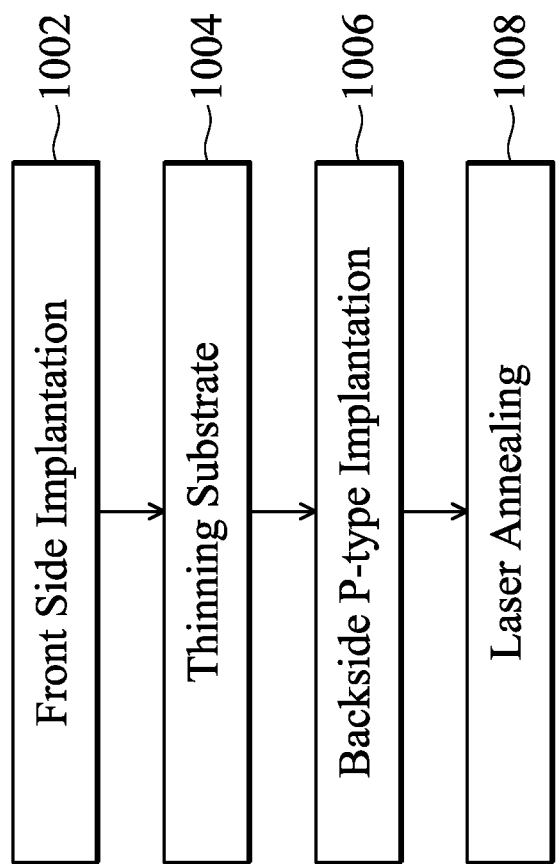
FIG. 10 illustrates a flow chart of a method for forming a backside illuminated image sensor in accordance with an embodiment.

FIG. 10 illustrates a flow chart of a method for forming a backside illuminated image sensor in accordance with an embodiment. At step 1002, a front side implantation process is applied to a CMOS image sensor wafer to form various doped regions such as photo active regions and isolation regions. In accordance with an embodiment, the photo active region may be of a depth of about 5 um.

At step 1004, the CMOS image sensor wafer is flipped and bonded on a carrier. According to the fabrication process of a backside illuminated image sensor wafer, a substrate thinning process is performed on the backside of the substrate so that the thickness of the substrate is reduced to about 5 um in thickness. Such a thinned substrate helps to allow light to propagate from the backside of the substrate.

At step 1006, through an ion implantation process, a thin p+ ion layer may be formed on the thinned substrate to improve quantum efficiency. In accordance with an embodiment, the thin p+ ion layer has a thickness in a range from about 100 Å to about 1 um. At step 1008, a laser annealing process is performed on the backside of the substrate to repair defects due to the p+ ion implantation and activate p+ ions.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method comprising:
forming a photo active region in a substrate using a front side ion implantation process, wherein the photo active region is of a first depth with respect to a front side of the substrate;
forming an isolation region having a bottom level with the first depth in the substrate;
after the step of forming the photo active region in the substrate, extending the photo active region from the first depth to a second depth using a first high energy ion implantation process, wherein the second depth is deeper than the first depth with respect to the front side of the substrate; and
after the step of forming the isolation region, extending the isolation region from the first depth to the second depth using a second high energy ion implantation process, wherein the photo active region is enclosed by the isolation region.

2. The method of claim 1, further comprising:
forming a dielectric layer over the photo active region; and
forming an interconnect layer over the dielectric layer.

3. The method of claim 1, further comprising:
forming a p+ layer on a backside of the substrate; and
applying a laser annealing process to the p+ layer.

4. The method of claim 3, further comprising:
forming a color filter layer on the p+ layer; and
forming a microlens layer on the color filter layer.

5. The method of claim 1, wherein:
the first high energy ion implantation process has a first energy level from about 300 keV to about 5000 keV; and
the second high energy ion implantation process has a second energy level from about 200 keV to about 3000 keV.

6. The method of claim 1, further comprising:
bonding the front side of the substrate on a carrier; and
thinning a backside of the substrate.

7. The method of claim 6, further comprising:
thinning the backside of the substrate until a thickness of the substrate is approximately equal to 5 um.

8. A method comprising:
providing a substrate with a first conductivity;
implanting ions with a second conductivity in the substrate from a front side of the substrate to form a first photo active region using an ion implantation process;
implanting ions with the first conductivity in the substrate from the front side of the substrate to form a second photo active region, wherein the first photo active region and the second photo active region form a photodiode with a first depth;
forming an isolation region having a bottom level with the first depth;
after the step of implanting ions with the first conductivity in the substrate from the front side of the substrate to form the second photo active region, extending the photodiode from the first depth to a second depth using a first high energy ion implantation process; and
after the step of forming the isolation region of the first depth, implanting ions with the first conductivity in the substrate from the front side of the substrate to extend the isolation region from the first depth to the second depth using a second high energy ion implantation process, wherein the isolation region has a same depth as the photodiode and the second depth is deeper than first depth with respect to the front side of the substrate.

9. The method of claim 8, further comprising:
thinning the substrate;
forming a p+ layer on a backside of the substrate; and
applying a laser annealing process to the p+ layer.

10. The method of claim 9, further comprising:
forming a color filter layer on the p+ layer; and
forming a microlens layer on the color filter layer.

11. The method of claim 8, wherein:
the first high energy ion implantation process has a first energy level from about 300 keV to about 5000 keV.

12. The method of claim 8, wherein:
the second high energy ion implantation process has a second energy level from about 200 keV to about 3000 keV.

13. The method of claim 8, further comprising:
forming a transistor adjacent to the photodiode on the front side of the substrate.

14. The method of claim 8, further comprising:
forming a shallow trench isolation structure in the isolation region.

15. A method comprising:
   implanting ions from a front side of a substrate to form a photo active region in the substrate, wherein the photo active region is of a first depth with respect to the front side of the substrate;
   forming an isolation region in the substrate, wherein a bottom of the isolation region is level with a bottom of the photo active region;
   after the step of implanting ions from the front side of the substrate to form the photo active region in the substrate, forming an extended photo active region using a first high energy ion implantation process, wherein the extended photo active region is deeper than the photo active region with respect to the front side of the substrate; and
   after the step of forming the isolation region, forming an extended isolation region using a second high energy ion implantation process, wherein:
      a bottom of the extended isolation region is level with a bottom of the extended photo active region; and
      the extended isolation region is deeper than the isolation region with respect to the front side of the substrate.

16. The method of claim 15, wherein:
   the photo active region is enclosed by the isolation region.

17. The method of claim 15, wherein:
   the extended photo active region is enclosed by the extended isolation region.

18. The method of claim 15, further comprising:
   implanting n-type ions in the substrate to form a first photo active region; and
   implanting p-type ions in the substrate to form a second photo active region, wherein the first photo active region and the second photo active region form the photo active region.

19. The method of claim 15, wherein:
   the first high energy ion implantation process has a first energy level from about 300 keV to about 5000 keV.

20. The method of claim 15, wherein:
   the second high energy ion implantation process has a second energy level from about 200 keV to about 3000 keV.

* * * * *